United States Patent
Kim et al.

(10) Patent No.: US 8,309,455 B2
(45) Date of Patent: Nov. 13, 2012

(54) SIH$_4$ SOAK FOR LOW HYDROGEN SIN DEPOSITION TO IMPROVE FLASH MEMORY DEVICE PERFORMANCE

(75) Inventors: Sung Jin Kim, Palo Alto, CA (US);
Alexander Nickel, Santa Clara, CA (US); Minh-Van Ngo, Fremont, CA (US); Hieu Trung Pham, Santa Clara, CA (US); Masato Tsuboi, Fukushima-ken (JP); Shinich Imada, Fukushima-ken (JP)

(73) Assignee: Spansion LLC, Sunnyvale, CA (US)

( * ) Notice: Subject to any disclaimer, the term of this patent is extended or adjusted under 35 U.S.C. 154(b) by 0 days.

(21) Appl. No.: 13/165,522

(22) Filed: Jun. 21, 2011

(65) Prior Publication Data
US 2011/0266609 A1    Nov. 3, 2011

Related U.S. Application Data

(62) Division of application No. 12/290,916, filed on Nov. 5, 2008, now Pat. No. 7,985,674.

(51) Int. Cl.
*H01L 21/4763* (2006.01)
(52) U.S. Cl. ......... 438/622; 438/618; 438/637; 438/672
(58) Field of Classification Search .......... 438/618–624, 438/637–638, 672–673, 700, 792
See application file for complete search history.

(56) References Cited

U.S. PATENT DOCUMENTS

| | | | |
|---|---|---|---|
| 6,566,718 B2 | 5/2003 | Wieczorek et al. | |
| 6,656,840 B2 | 12/2003 | Rajagopalan et al. | |
| 6,723,631 B2 * | 4/2004 | Noguchi et al. | 438/622 |
| 7,985,674 B2 * | 7/2011 | Kim et al. | 438/622 |
| 2008/0119047 A1 | 5/2008 | Yu et al. | |
| 2008/0150137 A1 | 6/2008 | Liu et al. | |

* cited by examiner

*Primary Examiner* — Dung A. Le

(57) ABSTRACT

Prior to deposition of a silicon nitride (SiN) layer on a structure, a non-plasma enhanced operation is undertaken wherein the structure is exposed to silane (SiH$_4$) flow, reducing the overall exposure of the structure to hydrogen radicals. This results in the silicon nitride being strongly bonded to the structure and in improved performance.

12 Claims, 6 Drawing Sheets

US 8,309,455 B2

SIH₄ SOAK FOR LOW HYDROGEN SIN DEPOSITION TO IMPROVE FLASH MEMORY DEVICE PERFORMANCE

CROSS-REFERENCES TO RELATED APPLICATIONS

This application is a Divisional application of and claims priority to U.S. application Ser. No. 12/290,916, filed Nov. 5, 2008, which is hereby incorporated in its entirety.

BACKGROUND OF THE INVENTION

1. Field of the Invention

This invention relates generally to memory devices, and more particularly, to an approach for reducing exposure of such a device to hydrogen in formation of a silicon nitride layer.

2. Discussion of the Related Art

FIG. 1 illustrates a flash memory cell 20 (as part of a wafer) in accordance with the prior art. As such, the cell on 20 in the form of a transistor includes a semiconductor substrate 22 in which source/drains 24, 26 are formed. Successive layers of gate dielectric 28, storage layer 30, dielectric 32 and control gate 34 are formed on the substrate 22. Silicide layers 36, 38, 40 are formed on the source/drains 24, 26 and the control gate 34. The memory cell 20 is programmable, upon application of appropriate voltages, by moving electrons from a source/drain through the gate dielectric 28 and into the storage layer 30, where such electrons are stored. The memory cell 20 is erasable, again upon application of appropriate voltages, by removing electrons from the storage layer 30 through the gate dielectric 28 and into a source/drain, as is well known.

Overlying this structure is a BPSG (or PSG) insulating layer 42. A tungsten body 44 extends through the layer 42 and in contact with silicide layer 36. Another tungsten body 46 extends through the layer 42 and in contact with silicide layer 40. A silicon dioxide ($SiO_2$) layer 48 is patterned as shown over the thus described structure, and copper 50 is deposited on the resulting structure, in contact with the tungsten bodies 44, 46.

Next, with reference to FIG. 2, a chemical-mechanical polishing (CMP) step is undertaken to planarize the structure, removing copper from over the $SiO_2$ layer 48 and leaving copper bodies 52, 54 in contact with the respective tungsten bodies 44, 46, forming respective conductors 56, 58. With reference to FIG. 3, in a relatively short period of time, exposure of the thus-formed structure to the atmosphere causes exposed copper of the copper bodies 52, 54 to oxidize, forming copper oxide ($CuO_2$) layers 60, 62 on the respective copper bodies 52, 54. These copper oxide layers 60, 62, if allowed to remain in place, can result in poor adhesion between the copper bodies 52, 54 and a silicon nitride (SiN) layer formed thereon, due to poor copper-silicon bonding at the interface thereof. This in turn results in poor electromigration and stress-migration performance. In addition, traces of copper may remain on the $SiO_2$ layer 48 after the CMP step, and copper can also readily migrate from the copper bodies 52, 54 onto the top surface of the layer 42. This can result in undesired current leakage between adjacent conductors 56, 58. Indeed, as devices shrink in size with continued progress in technology, the distance between the conductors decreases, increasing the likelihood of undesired conductor-to-conductor leakage.

To overcome this problem, a plasma-enhanced pre-treatment step is undertaken as illustrated in FIG. 4. The thus far formed structure (as part of a wafer) is placed on and heated by a heater 66 in a chamber 68, and ammonia ($NH_3$) is drawn into the chamber 68 by vacuum pump 70. RF power is applied into the chamber 68 so that a plasma etch is undertaken, removing the copper oxide 60, 62 from the copper bodies 52, 54 and removing the copper from the top surface of the BPSG layer 42.

Next, and with reference to FIG. 5, with the structure still being heated by the heater in the chamber, silane ($SiH_4$), ammonia ($NH_3$), and nitrogen ($N_2$, dilutant) are drawn into the chamber 68 by vacuum pump 70. RF power is applied into the chamber 68, and through these steps, a silicon nitride layer 72 is formed on the resulting structure by plasma-enhanced deposition, in contact with the copper bodies 52, 54 and $SiO_2$ layer 48.

While these steps are effective for their purpose (i.e., good removal of copper oxide from the copper bodies 52, 54 and good removal of copper from the upper surface of the $SiO_2$ layer 48 is achieved by the plasma-enhanced treatment step of FIG. 4, and good Cu—Si bonding is achieved at the interface of the copper-silicon nitride in plasma-enhanced deposition of the silicon nitride layer 72 as in FIG. 5), a significant amount of hydrogen is involved in the overall process (contained in the ammonia in plasma-enhanced operations of the FIGS. 4 and 5 and in the silane of the operation of FIG. 5), and the plasma-enhanced operations of FIGS. 4 and 5 excite hydrogen of the ammonia and silane to form a significant amount of highly reactive hydrogen radicals, which can readily penetrate the BPSG (or PSG) layer 42 and the transistor 20 itself, resulting in decreased memory cell performance. In addition, depending on the present conditions, a significant amount of silicon-hydrogen bonding can exist in the silicon nitride layer 72, which has been found to result in degraded device cycling and charge loss/charge gain data.

Reduction of silane flow in the step of FIG. 5 reduces formation of hydrogen radicals, which in turn reduces silicon-hydrogen bonding in the silicon nitride layer 72, lessening the problems caused thereby. However, this also results in reduced Cu—Si bonding at the silicon nitride-copper interface, which reduces adhesion between the copper bodies 52, 54 and the silicon nitride layer 72.

Therefore, what is needed is an approach wherein a proper structure is formed, meanwhile with reduced exposure of the structure to hydrogen radicals, and meanwhile achieving good Cu—Si bonding at the silicon nitride-copper interface for good adhesion of the silicon nitride layer 72 to the copper bodies 52, 54, so as to improve performance thereof as compared to the above-described the approach.

SUMMARY OF THE INVENTION

Broadly stated, the present method of fabricating an electronic structure comprises providing a copper-containing body, and exposing the copper-containing body to a silicon-containing entity in a non-plasma operation, to provide silicon-copper bonding in a resulting copper-containing body.

Broadly stated, the present electronic structure comprises a copper-containing body, a copper silicide layer on the copper-containing body, and a silicon nitride layer in contact with the copper silicide layer.

The present invention is better understood upon consideration of the detailed-description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

DETAILED DESCRIPTION

Reference is now made in detail to a specific embodiment of the present invention which illustrates the best mode presently contemplated by the inventors for practicing the invention.

Figure 6:
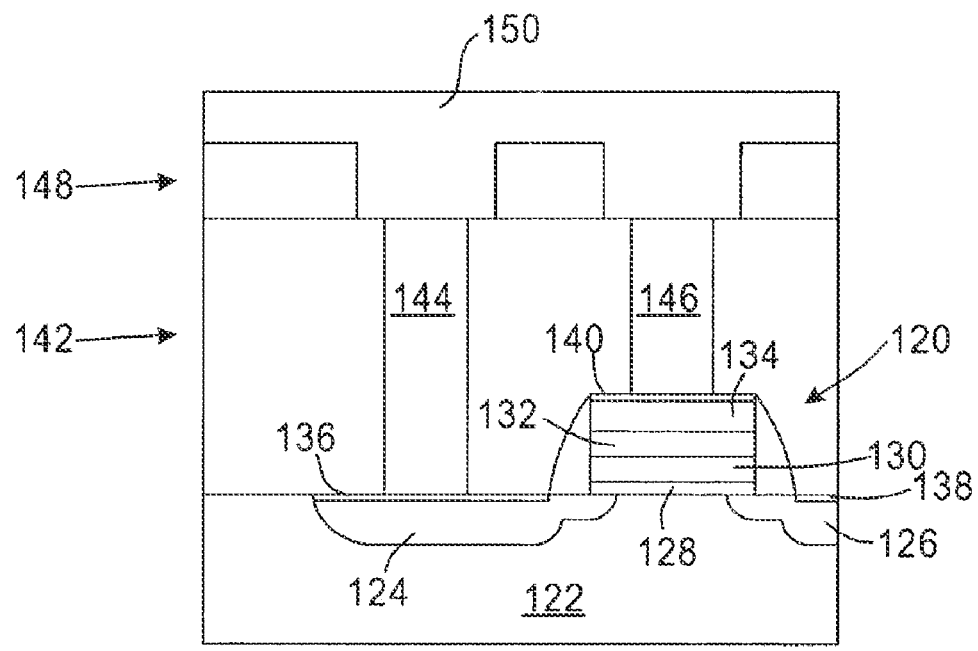
FIGS. 6-11 illustrate the present approach for forming a silicon nitride layer in an electronic structure.

FIGS. 6-9 illustrate steps as set forth in FIGS. 1-4 described above. As such, FIG. 6 illustrates a flash memory cell 120 (as part of a wafer) in the form of a transistor in accordance with the prior art. As such, the cell 122 includes a semiconductor substrate 122 in which source/drains 124, 126 are formed. Successive layers of gate dielectric 128, storage layer 130, dielectric 132 and control gate 134 are formed on the substrate 122. Silicide layers 136, 138, 40 are formed on the source/drains 124, 126 and the control gate 134. The memory cell 120 is programmable, upon application of appropriate voltages, by moving electrons from a source/drain through the gate dielectric 128 and into the storage layer 130, where such electrons are stored. The memory cell 120 is erasable, again upon application of appropriate voltages, by removing electrons from the storage layer 130 through the gate dielectric 128 and into a source/drain, as is well known.

Overlying this structure is a BPSG (or PSG) insulating layer 142. A tungsten body 144 extends through the layer 142 and in contact with silicide layer 136. Another tungsten body 146 extends through the layer 142 and in contact with silicide layer 140. A silicon dioxide ($SiO_2$) layer 148 is patterned as shown over the thus described structure, and copper 150 is deposited on the resulting structure, in contact with the tungsten bodies 144, 146.

Figure 7:
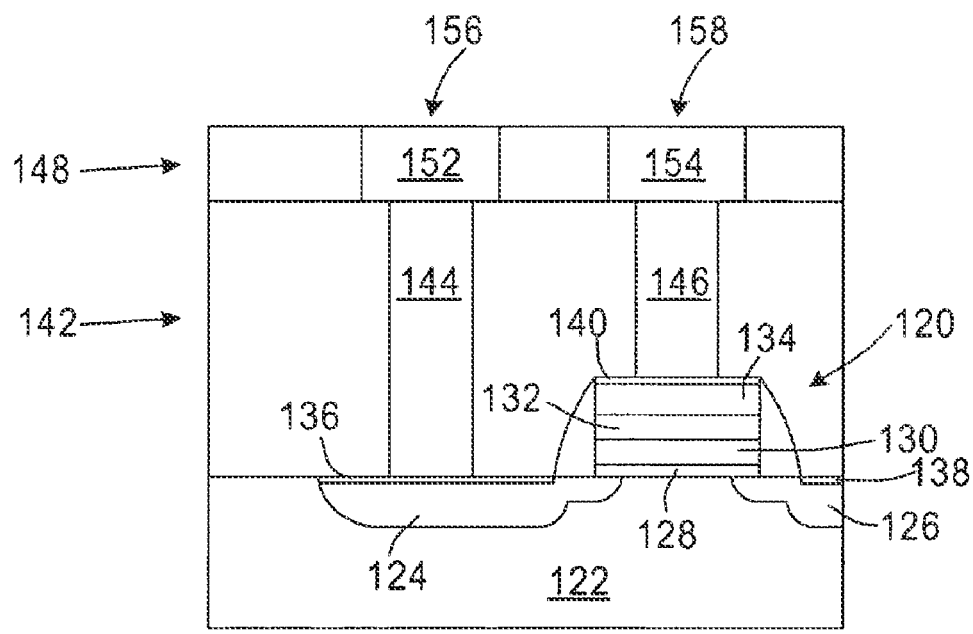
Figure 8:
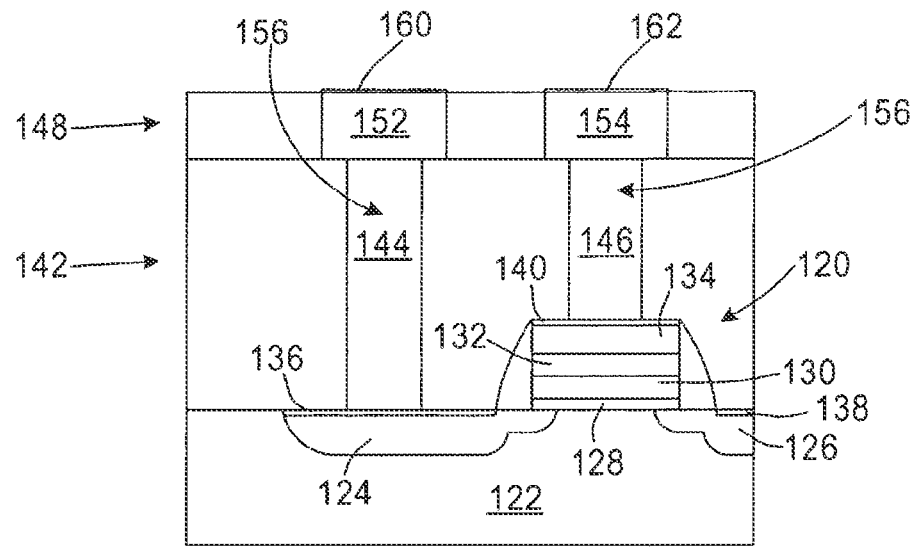

Next, with reference to FIG. 7, a chemical-mechanical polishing (CMP) step is undertaken to planarize the structure, removing copper from over the silicon dioxide layer 148 and leaving copper bodies 152, 154 in contact with the respective tungsten bodies 144, 146, forming respective conductors 156, 158, with the copper bodies 152, 154 being in electrical connection with the source/drain 124 and control gate 134 respectively. As described above, in a relatively short period of time, exposure of the thus-formed structure to the atmosphere causes exposed copper of the copper bodies 152, 154 to oxidize, forming copper oxide ($CuO_2$) layers 160, 162 on the respective copper bodies 152, 154. In addition, traces of copper may remain on the silicon dioxide layer 148 after the CMP step, and copper can also readily migrate from the copper bodies 152, 154 onto the top surface of the silicon dioxide layer 148 (FIG. 8).

Figure 9:
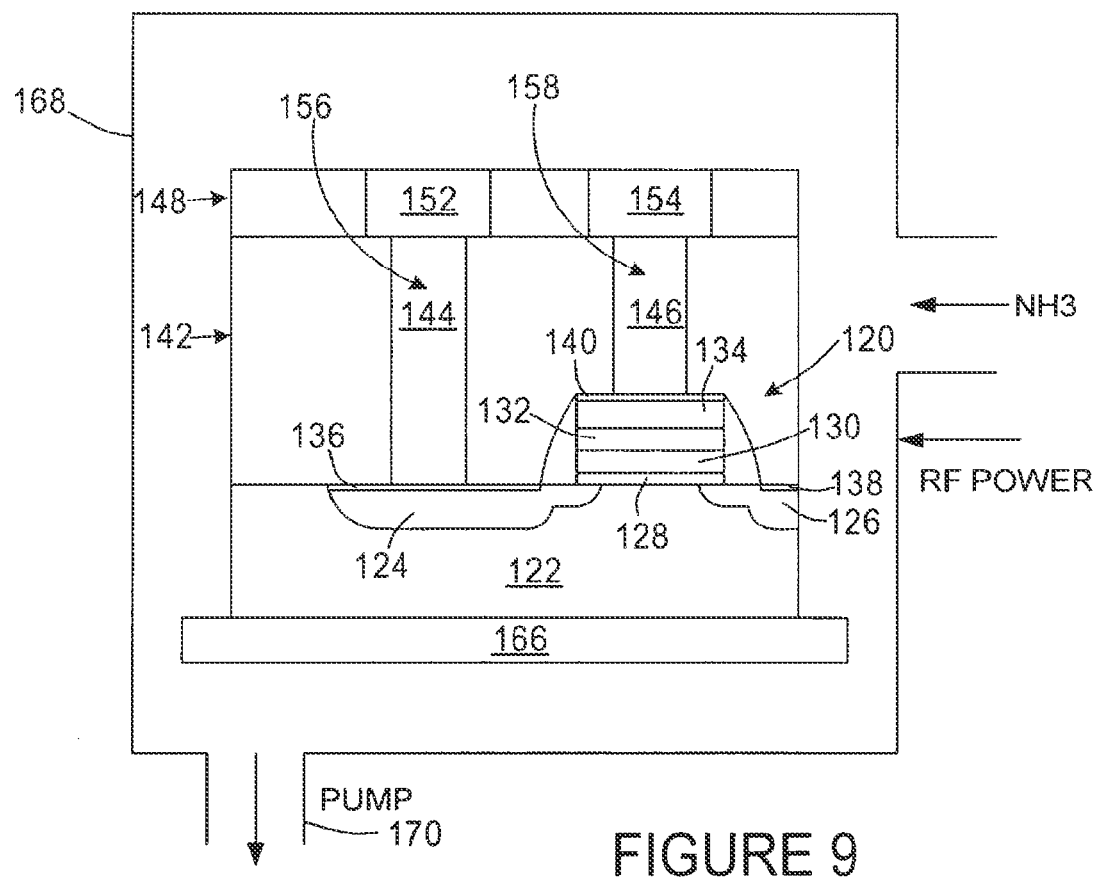

As set forth above, a plasma-enhanced pre-treatment step is undertaken as illustrated in FIG. 9. The structure thus far formed (as part of a wafer) is placed on and heated by a heater 166 in a chamber 168, and ammonia ($NH_3$) is drawn into the chamber 168 by vacuum pump 170. RF power is applied into the chamber 168 so that a plasma treatment is undertaken, removing the copper oxide 160, 162 from the copper bodies 152, 154 and removing the copper from the top surface of the silicon dioxide layer 148. The parameters for this step are as follows:

$NH_3$ flow: 100-1000 sccm (in this embodiment 160 sccm)
Temperature: 300°-500° C. (in this embodiment 400° C.)
Time: 0.1-60 second (in this embodiment 10 seconds)
RF Power: 10-3000 watts (in this embodiment (300 watts)
Pressure: 0.1-100 Torr (in this embodiment 4.2 Torr)

Figure 10:
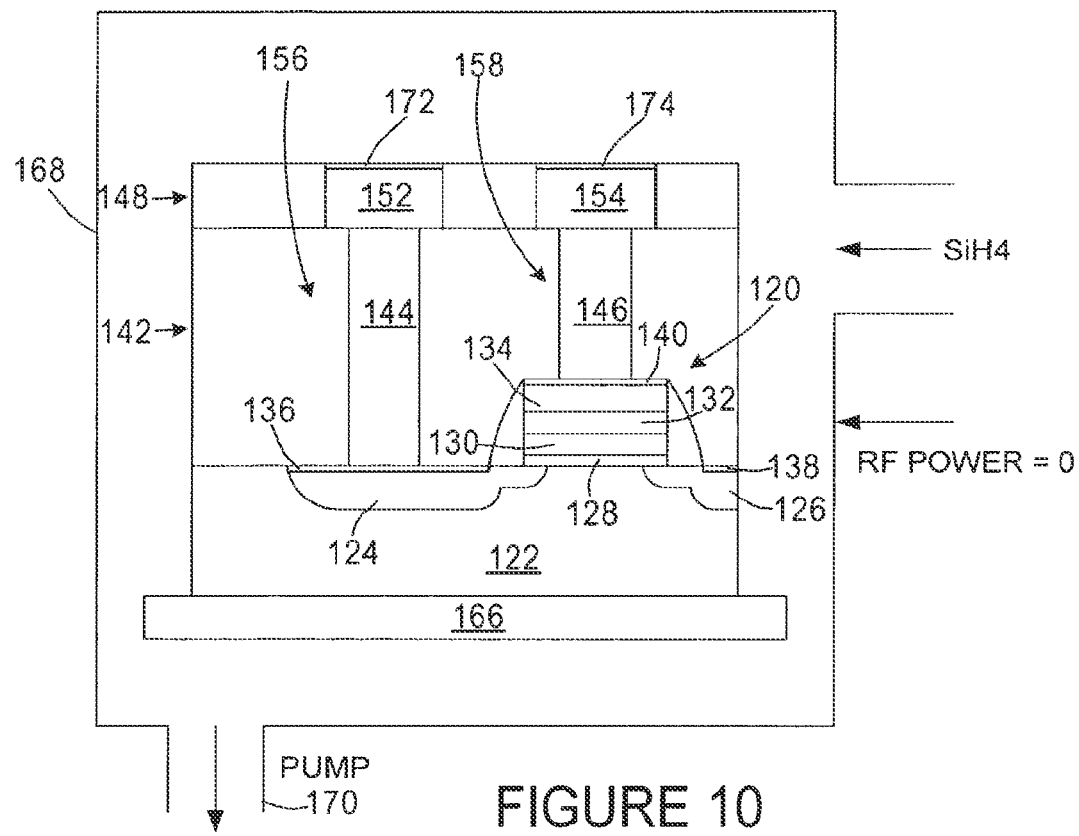

Next, and with reference to FIG. 10, an $SiH_4$ soak is undertaken on the structure, that is, the structure is exposed to $SiH_4$ in a non-plasma operation, i.e., the RF power is set to zero (RF power off). In such operation, silicon from the $SiH_4$ bonds with copper of the copper bodies 152, 154 to provide strong silicon-copper bonding in the form of copper silicide layers 172, 174 on the surfaces of the remaining copper. With no RF power being applied, hydrogen radicals do not flow into the BPSG layer 142 or transistor 20. The parameters for this step are as follows:

$SiH_4$ flow: 10-1000 sccm (in this embodiment 332 sccm)
Temperature: 300°-500° C. (in this embodiment 400° C.)
Time: 0.1-10 seconds (in this embodiment 1 second)
RF Power: 0 (turned off)
Pressure: 0.1-100 Torr (in this embodiment 4.2 Torr)

Figure 11:
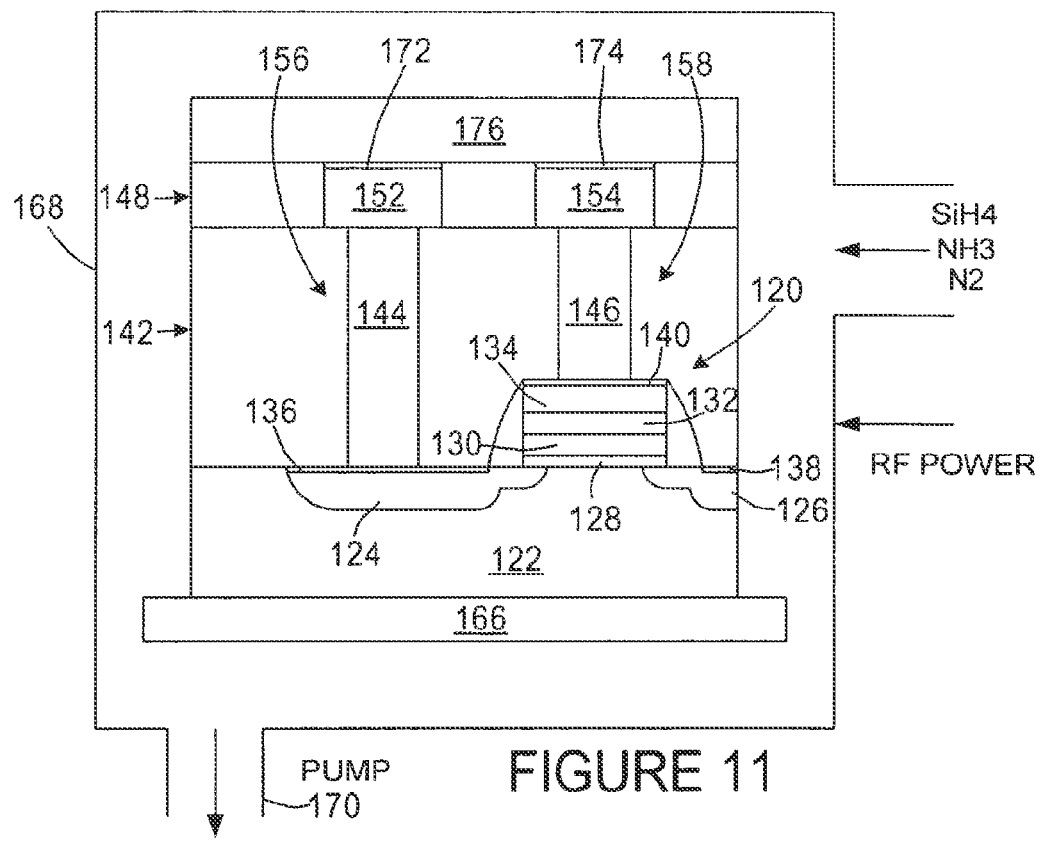

Next, and with reference to FIG. 11, with the device still being heated by the heater 166 in the chamber 168, silane ($SiH_4$), ammonia ($NH_3$), and nitrogen ($N_2$, dilutant) are drawn into the chamber 168 by vacuum pump 170. RF power is applied into the chamber 168, and through these steps, a silicon nitride (SiN, for example $Si_3N_4$) layer 176 is formed on the resulting structure by plasma-enhanced deposition, in contact with the copper silicide layers 172, 174 and silicon dioxide layer 148. The parameters for this step are as follows:

$SiH_4$ flow: 50-70% of prior art flow rate (prior art flow rate being for example 500 sccm)
$NH_3$ flow: 100-1000 sccm (in this embodiment 320 sccm)
$N_2$ flow: 10,000-30,000 sccm (in this embodiment 22000 sccm)
Temperature: 300°-500° C. (in this embodiment 400° C.)
Time: As needed for desired thickness of layer
RF Power: 10-3000 watts (in this embodiment (830 watts)
Pressure: 0.1-100 Torr (in this embodiment 4.2 Torr)

Figure 1:
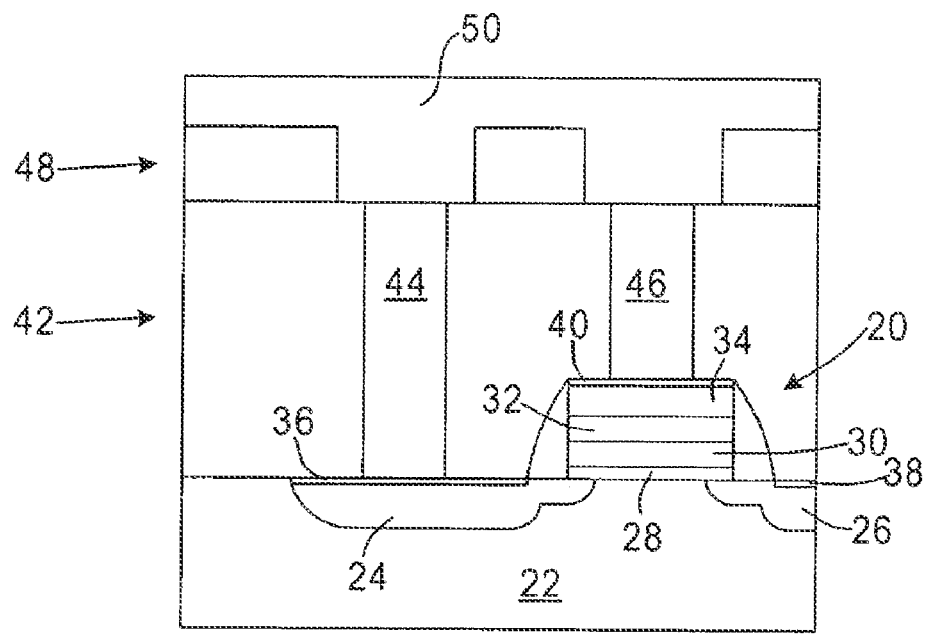
FIGS. 1-5 illustrate an approach in accordance with the prior art for forming a silicon nitride layer in an electronic structure.
Figure 2:
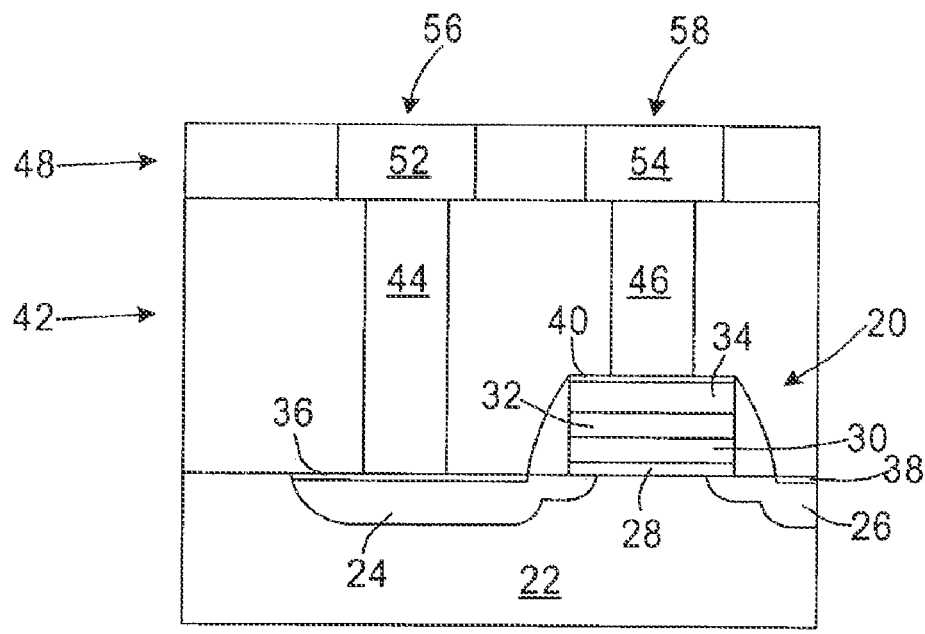
Figure 3:
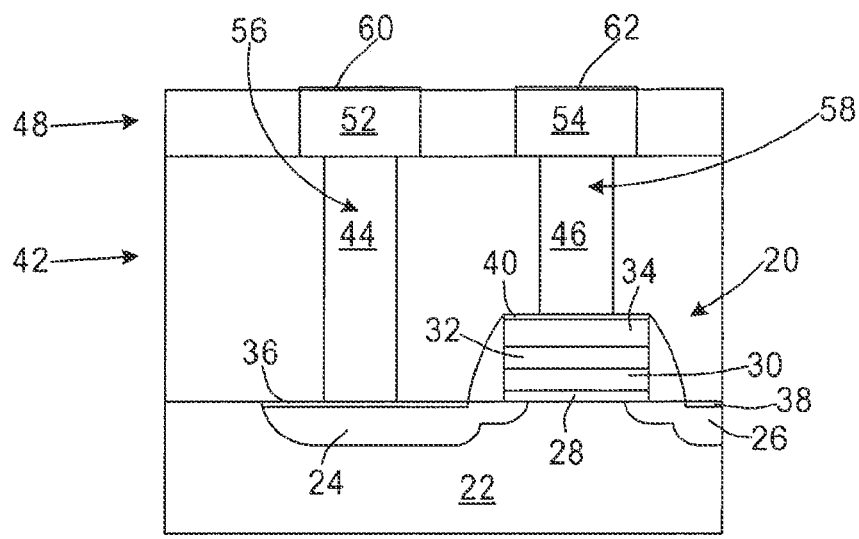
Figure 4:
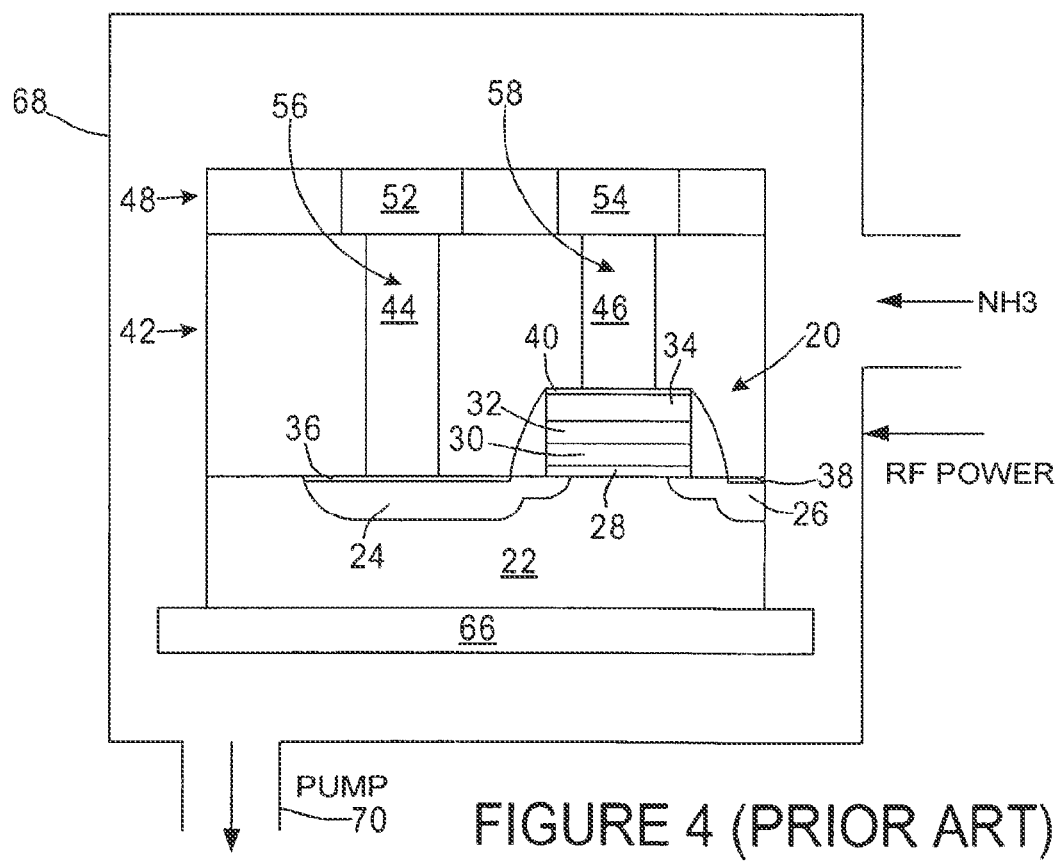
Figure 5:
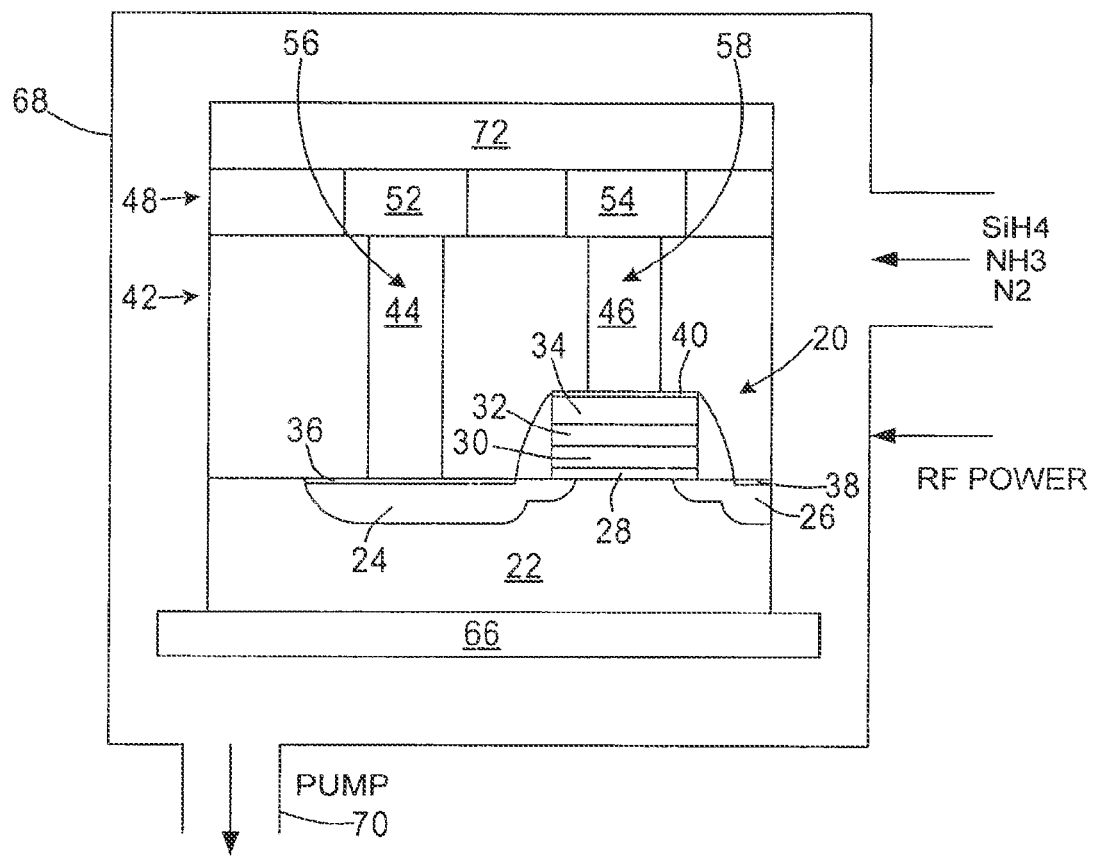

The copper silicide layers 172, 174 have strong copper-silicide bonding, and silicon of the silicon nitride layer 176 strongly bonds with the copper silicide layers 172, 174, resulting in these elements being strongly bonded together, i.e., strong adhesion of the silicon nitride layer 176 and the copper bodies 152, 154 is achieved. In addition, with the flow of $SiH_4$ being substantially lower in the silicon nitride deposition step of FIG. 11 than that of FIG. 5 (even though the other parameters may be similar to those of the FIG. 5 process), and with hydrogen radicals not flowing into the BPSG layer 142 or transistor 120 in the step of FIG. 10, the exposure of the BPSG layer 142 and transistor 120 to hydrogen radicals in the overall process is substantially reduced, improving memory cell performance. Additionally, significantly lower silicon-hydrogen bonding occurs in the silicon nitride layer 176, improving device cycling and charge loss/charge gain performance.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of fabricating an electronic structure comprising:
    forming at least one copper containing body;
    performing a plasma treatment on the electronic structure to remove copper oxide layers from the at least one copper containing body;
    performing a non-plasma treatment on the electronic structure to form copper silicide layers on the at least one copper containing body;
    performing a plasma-enhanced deposition to deposit a silicon nitride layer on the electronic structure to contact the copper silicide layers.

2. The method of claim 1, wherein performing a non-plasma treatment comprises exposing the electronic structure to a silicon-containing entity.

3. The method of claim 2, wherein performing a non-plasma treatment comprises exposing the electronic structure to silane.

4. The method of claim 1, wherein a first copper containing body is in electrical connection with a control gate of a transistor.

5. The method of claim 1, wherein a second copper containing body is in electrical connection with a source of a transistor, and wherein a third copper containing body is in electrical connection with a drain of the transistor.

6. The method of claim 1, wherein performing a plasma-enhanced deposition comprises exposing the electronic structure to silane and ammonia.

7. The method of claim 1, wherein performing a plasma treatment on the electronic structure comprises exposing the electronic structure to ammonia at 100-1000 sccm, at a temperature of 300-500 degrees centigrade, at an RF power of 10-3000 watts, and at a pressure of 0.1-100 Torr, and wherein the plasma treatment is performed for 0.1-60 seconds.

8. The method of claim 7, wherein performing a plasma treatment on the electronic structure comprises exposing the electronic structure to ammonia at 160 sccm, at a temperature of 400 degrees centigrade, at an RF power of 300 watts, and at a pressure of 4.2 Torr, and wherein the plasma treatment is performed for 10 seconds.

9. The method of claim 1, wherein performing a non-plasma treatment on the electronic structure comprises exposing the electronic structure to silane at 10-1000 sccm, at a temperature of 300-500 degrees centigrade, and at a pressure of 0.1-100 Torr for 0.1-10 seconds.

10. The method of claim 9, wherein performing a non-plasma treatment on the electronic structure comprises exposing the electronic structure to silane at 322 sccm, at a temperature of 400 degrees centigrade, and a pressure of 4.2 Torr for 1 second.

11. The method of claim 1, wherein performing a plasma-enhanced deposition on the electronic structure comprises exposing the electronic structure to silane at 250-350 sccm, ammonia at 100-1000 sccm, and nitrogen at 10,000-30,000 sccm, at 300-500 degrees centigrade, at an RF power of 10-3000 watts, and at a pressure of 0.1-100 Torr.

12. The method of claim 11, wherein performing a plasma-enhanced deposition on the electronic structure comprises exposing the electronic structure to silane at 250-350 sccm, ammonia at 320 sccm, and nitrogen at 22000 sccm, at 400 degrees centigrade, at an RF power of 830 watts, and at a pressure of 4.2 Torr.

* * * * *